United States Patent
Kanda et al.

(10) Patent No.: US 10,450,944 B2
(45) Date of Patent: Oct. 22, 2019

(54) CONTROL APPARATUS AND METHOD FOR INTERNAL COMBUSTION ENGINE

(71) Applicant: HITACHI AUTOMOTIVE SYSTEMS, LTD., Hitachinaka-shi, Ibaraki (JP)

(72) Inventors: Kousuke Kanda, Isesaki (JP); Yoshitatsu Nakamura, Isesaki (JP); Tomoyuki Murakami, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 28 days.

(21) Appl. No.: 15/512,736

(22) PCT Filed: Oct. 7, 2015

(86) PCT No.: PCT/JP2015/078515
§ 371 (c)(1),
(2) Date: Mar. 20, 2017

(87) PCT Pub. No.: WO2016/060047
PCT Pub. Date: Apr. 21, 2016

(65) Prior Publication Data
US 2017/0292437 A1  Oct. 12, 2017

(30) Foreign Application Priority Data

Oct. 17, 2014  (JP) .................. 2014-212779

(51) Int. Cl.
*F02B 31/02* (2006.01)
*F02D 41/34* (2006.01)
(Continued)

(52) U.S. Cl.
CPC .............. *F02B 31/02* (2013.01); *F02D 21/08* (2013.01); *F02D 41/02* (2013.01); *F02D 41/06* (2013.01);
(Continued)

(58) Field of Classification Search
CPC .............. F02D 21/08; F02D 2200/101; F02D 2200/1012; F02D 41/02; F02D 41/06;
(Continued)

(56) References Cited

FOREIGN PATENT DOCUMENTS

| JP | 63-111251 A | 5/1988 |
|---|---|---|
| JP | 02-115542 A | 4/1990 |

(Continued)

*Primary Examiner* — Phutthiwat Wongwian
*Assistant Examiner* — Diem T Tran
(74) *Attorney, Agent, or Firm* — Foley & Lardner LLP

(57) ABSTRACT

The present invention relates to a control apparatus and method for an internal combustion engine including two fuel injection valves in the intake port of each cylinder. In the present invention, fuel injection from a first fuel injection valve is activated while fuel injection from a second fuel injection valve is temporarily stopped at the resumption of fuel injection from the deceleration fuel cut-off state in response to a decrease in the engine rotation speed. The amount of minimum fuel injection to each cylinder that ensures the accuracy of fuel measurement can be reduced, and fuel is injected from the first fuel injection valve in an amount equal to or greater than the amount of minimum fuel injection. Thus, fuel injection can be resumed at a lower engine speed than when fuel injection is resumed from the two fuel injection valves.

4 Claims, 8 Drawing Sheets

(51) Int. Cl.
*F02D 21/08* (2006.01)
*F02D 41/02* (2006.01)
*F02D 41/06* (2006.01)
*F02D 41/10* (2006.01)
*F02P 5/15* (2006.01)
*F02D 41/12* (2006.01)
*F02D 41/30* (2006.01)
*H03K 7/08* (2006.01)

(52) U.S. Cl.
CPC .......... *F02D 41/10* (2013.01); *F02D 41/126* (2013.01); *F02D 41/3094* (2013.01); *F02D 41/34* (2013.01); *F02P 5/1506* (2013.01); *F02P 5/1512* (2013.01); *F02D 2200/101* (2013.01); *F02D 2200/1012* (2013.01); *H03K 7/08* (2013.01); *Y02T 10/146* (2013.01); *Y02T 10/44* (2013.01)

(58) Field of Classification Search
CPC .... F02D 41/10; F02D 41/126; F02D 41/3094; F02D 41/34; F02P 5/1506; F02P 5/1512; F02B 31/02; Y02T 10/146; Y02T 10/44
See application file for complete search history.

(56) References Cited

FOREIGN PATENT DOCUMENTS

| | | | |
|---|---|---|---|
| JP | 02-119656 | * | 5/1990 |
| JP | 02-119656 A | | 5/1990 |
| JP | 04-128526 | * | 4/1992 |
| JP | 04-128526 A | | 4/1992 |
| JP | 04-134145 A | | 5/1992 |
| JP | 06-010804 A | | 1/1994 |
| JP | 2010-053758 A | | 3/2010 |
| JP | 2011-052588 A | | 3/2011 |
| JP | 2011-132918 A | | 7/2011 |
| WO | WO-2013/054391 A1 | | 4/2013 |

* cited by examiner

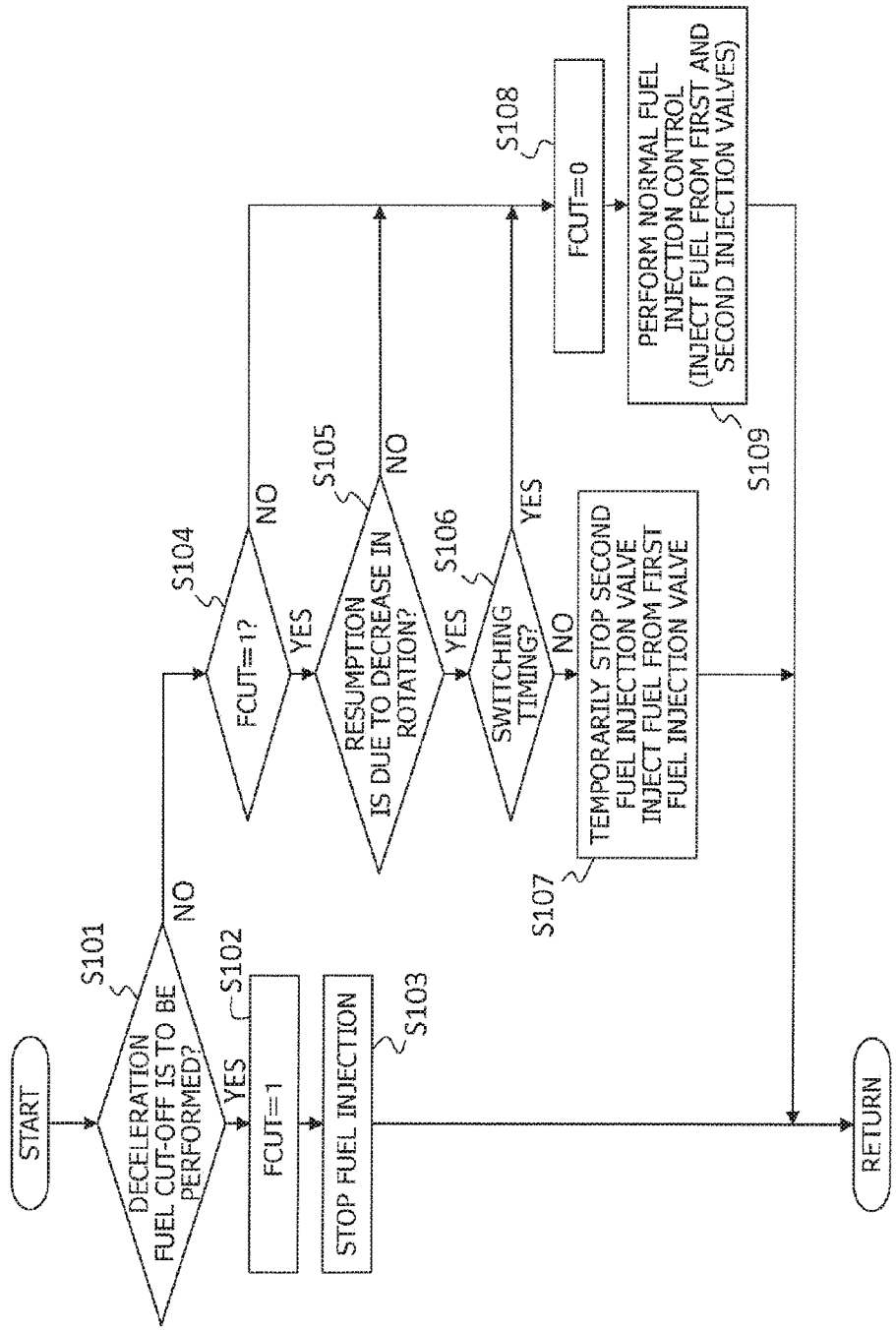

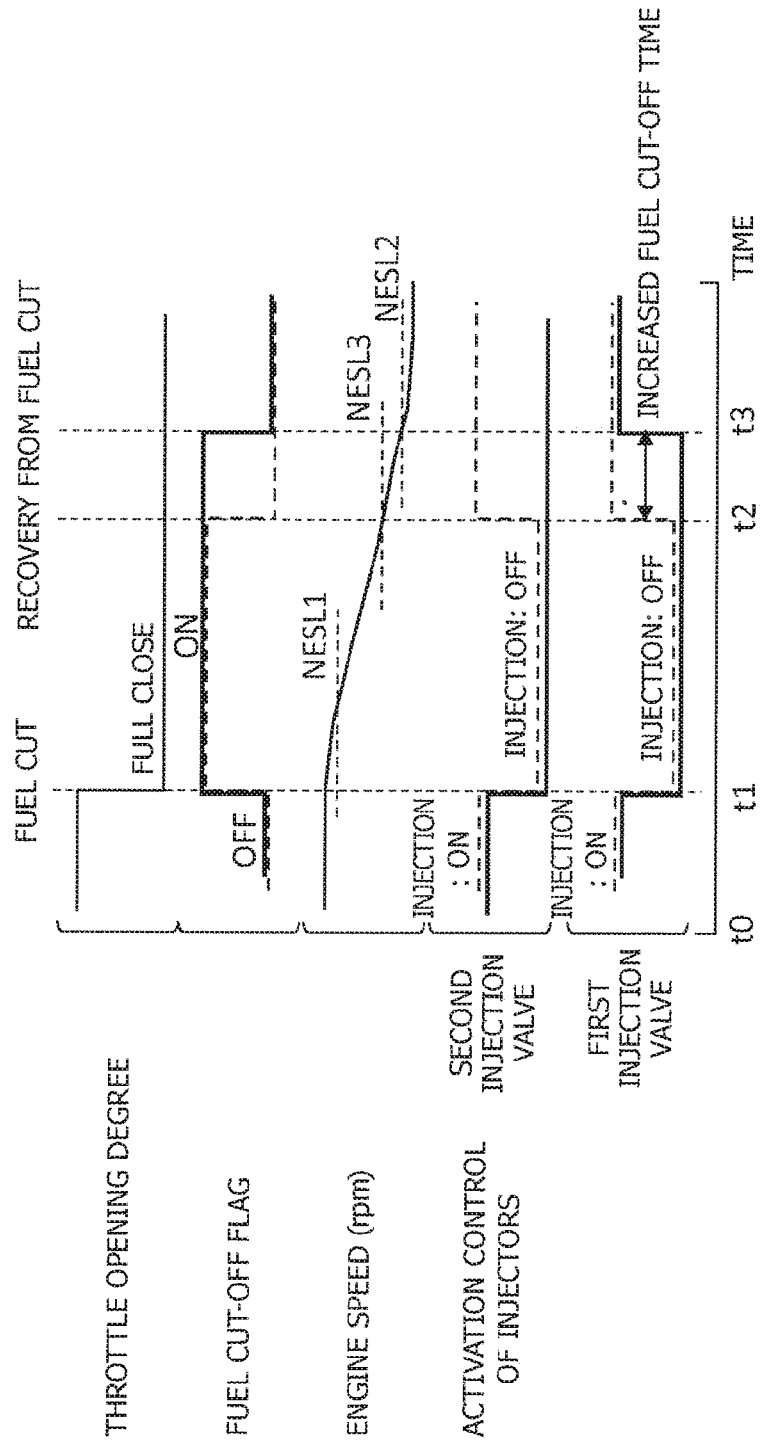

CONTROL APPARATUS AND METHOD FOR INTERNAL COMBUSTION ENGINE

TECHNICAL FIELD

The present invention relates to a control apparatus and method for an internal combustion engine, specifically to injection control performed at the resumption of fuel injection from a fuel cut-off state in an internal combustion engine including a first fuel injection valve and a second fuel injection valve in the intake port of each cylinder.

BACKGROUND ART

Patent Document 1 discloses the internal combustion engine that includes a plurality of cylinders arranged side by side in a predetermined arrangement direction. Each cylinder is connected to the first and second intake ports. Through the first intake port, intake air is introduced to an area located on one side in the arrangement direction where the in-cylinder combustion temperature is relatively high in the cylinder. Through the second intake port, intake air is introduced to an area located on the other side in the arrangement direction where the in-cylinder combustion temperature is relatively low in the cylinder. The first fuel injection valve is provided to the first intake port, and the second fuel injection valve is provided to the second intake port.

Patent Document 1 also discloses a means for controlling the amounts of fuel injection from the fuel injection valves such that the amount of fuel injection from the first fuel injection valve is larger than that from the second fuel injection valve. The control means prohibits any difference between the fuel injection amounts from the first and second fuel injection valves when the internal combustion engine is in a process of recovery from the fuel cut-off.

REFERENCE DOCUMENT LIST

Patent Document

Patent Document 1 JP 2011-052588 A

SUMMARY OF THE INVENTION

Problems to be Solved by the Invention

When the injection pulse width for a fuel injection valve is too small, a large gap occurs between the injection pulse width and the actual value of the amount of fuel injection from the fuel injection valve; in other words, a large gap occurs between the actual and indicated values of the amount of fuel injection from the fuel injection valve, and the accuracy of fuel measurement decreases.

To avoid this, in an internal combustion engine having two fuel injection valves in the intake port of each cylinder, it is necessary to inject fuel under the condition where the injection pulse width for each fuel injection valve is longer than the minimum pulse width that ensures sufficient measurement accuracy.

When, in response to the engine rotation speed decreasing to a threshold, fuel injection is resumed from the state in which deceleration fuel cut-off is active, the amount of fuel injection per cylinder reaches the minimum at the time of the resumption in typical cases. In addition, the amount of fuel injection at the resumption of fuel injection becomes smaller if the engine rotation speed is lower at the resumption.

Here, the fuel economy can be improved more as fuel injection is resumed at a lower engine rotation speed.

However, if fuel is injected using the two fuel injection valves at the resumption of fuel injection, such resumption of fuel injection may be permitted when the engine rotation speed remains still high such that the current amount of fuel injection corresponds to at least twice the minimum pulse width; in other words, such resumption may be permitted under the condition where fuel will be injected from each fuel injection valve according to a pulse width equal to or greater than the minimum pulse width. This makes it difficult to sufficiently lower the engine rotation speed at which fuel injection is resumed, and that is problematic.

In view of the above, an object of the present invention is to provide a control apparatus and method for an internal combustion engine including two fuel injection valves in the intake port of each cylinder, which control apparatus and method makes it possible to set, as low as possible, an engine rotation speed at which fuel injection is resumed from the state in which deceleration fuel cut-off is active.

Means for Solving the Problems

Thus, according to the present invention, a control apparatus for an internal combustion engine which includes a first fuel injection valve and a second fuel injection valve in an intake port of each cylinder includes a control unit for cutting off fuel injection during deceleration of the internal combustion engine, and for activating fuel injection from the first fuel injection valve while temporarily stopping fuel injection from the second fuel injection valve at resumption, from a state in which fuel injection is cut off, of fuel injection in response to a decrease in an engine rotation speed.

A control method for an internal combustion engine which includes a first fuel injection valve and a second fuel injection valve in an intake port of each cylinder, according to the present invention, includes the steps of: temporarily stopping fuel injection from the first fuel injection valve and fuel injection from the second fuel injection valve during deceleration of the internal combustion engine; and activating fuel injection from the first fuel injection valve while temporarily stopping fuel injection from the second fuel injection valve at the resumption of fuel injection in response to a decrease in an engine rotation speed.

Effects of the Invention

The invention described above makes it possible to improve fuel economy of the internal combustion engine by setting, as low as possible, an engine rotation speed at which fuel injection is resumed from a state in which deceleration fuel cut-off is active.

BRIEF DESCRIPTION OF THE DRAWINGS

FIG. 1A includes a top view of a cylinder head and a block diagram of a control system; and FIG. 1B is a side view of the cylinder.

FIG. 2 is a flowchart illustrating control for resuming fuel injection from a state in which deceleration fuel cut-off is active, according to an embodiment of the present invention.

FIG. 3 is a time chart exemplifying fuel injection operation from fuel injection valves at the resumption of fuel injection from the state in which deceleration fuel cut-off is active, according to an embodiment of the present invention.

MODE FOR CARRYING OUT THE INVENTION

An embodiment of the present invention will be described below.

Figure 1A:
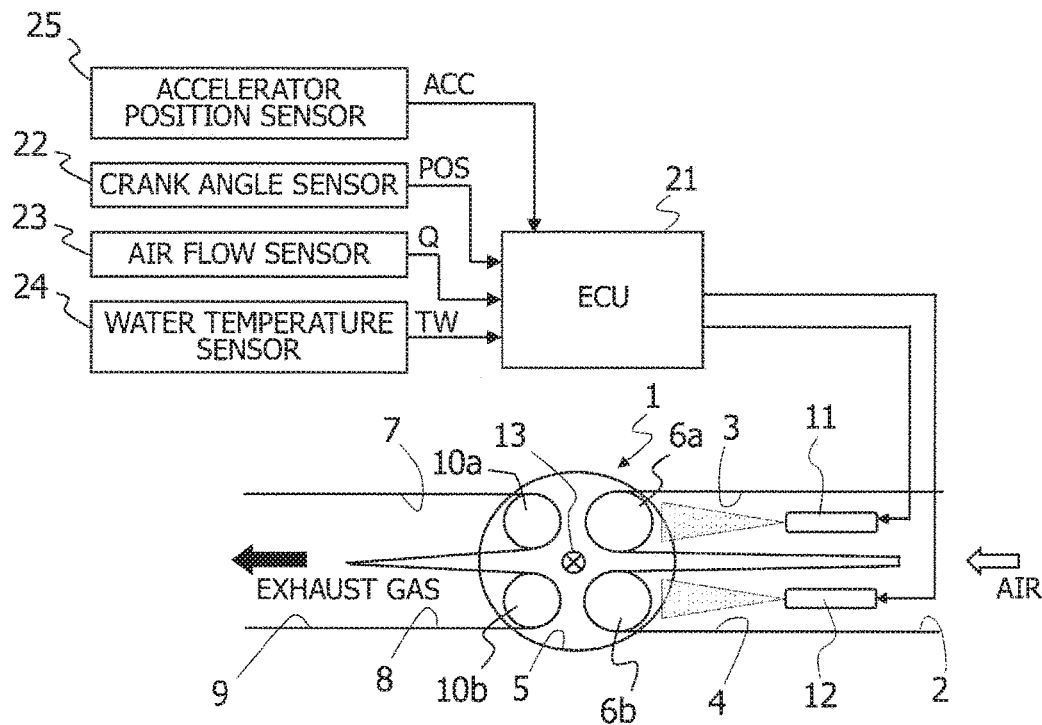
FIGS. 1A and 1B illustrate an internal combustion engine according to an embodiment of the present invention.
Figure 1B:
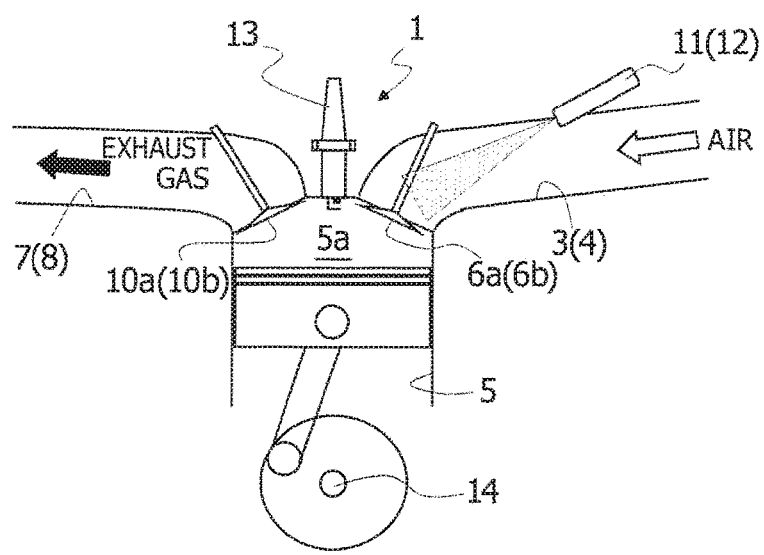

FIGS. 1A and 1B illustrate an example of an internal combustion engine to which the control apparatus and method according to the present invention is applied.

In an internal combustion engine 1 in FIGS. 1A and 1B, the downstream side of an intake passage 2 for each cylinder 5 branches into a first intake port 3 and a second intake port 4, and the downstream end of each of first intake port 3 and second intake port 4 independently opens to cylinder 5.

An intake valve 6a is interposed between cylinder 5 and the opening of first intake port 3 to open and close the opening. An intake valve 6b is interposed between cylinder 5 and the opening of second intake port 4 to open and close the opening.

The upstream ends of a first exhaust port 7 and a second exhaust port 8 are independently open to cylinder 5, and the downstream sides of first exhaust port 7 and second exhaust port 8 are combined and connected to an exhaust passage 9.

An exhaust valve 10a is interposed between cylinder 5 and the opening of first exhaust port 7 to open and close the opening. An exhaust valve 10b is interposed between cylinder 5 and the opening of second exhaust port 8 to open and close the opening.

A first fuel injection valve 11, which is disposed in first intake port 3, injects fuel to a bevel portion of intake valve 6a which opens and closes first intake port 3.

A second fuel injection valve 12, which is disposed in second intake port 4, injects fuel to a bevel portion of intake valve 6b which opens and closes second intake port 4.

First fuel injection valve 11 has the same injection characteristics as second fuel injection valve 12. Such injection characteristics include a spray angle, a spray particle size, a spray penetration force, an injection amount per unit of opening time, and a minimum pulse width Ti2min at which the accuracy of fuel measurement is above the lower limit. In other words, first fuel injection valve 11 is the same type of fuel injection valve as second fuel injection valve 12.

Each of first fuel injection valve 11 and second fuel injection valve 12 opens in accordance with an injection pulse signal outputted as a drive signal by an electronic control unit (ECU) 21, and injects fuel in an amount proportional to the injection time or the time during which the valve open.

The fuel taken in with air in a combustion chamber 5a of cylinder 5 is spark-ignited by an ignition plug 13 and burned.

ECU 21 incorporates a microcomputer including a CPU which serves as a processor, a ROM, a RAM, an input-output circuit, and the like.

ECU 21 receives output signals from various sensors for sensing the operational state of internal combustion engine 1. Based on these signals, ECU 21 detects injection timings at which fuel is to be injected from fuel injection valves 11 and 12, and calculates the pulse widths of the injection pulse signals to be outputted to fuel injection valves 11 and 12. Then, ECU 21 outputs the injection pulse signals having the pulse widths thus calculated to fuel injection valves 11 and 12 at the predetermined injection timings.

The various sensors include a crank angle sensor 22, an air flow sensor 23, a water temperature sensor 24, and an accelerator position sensor 25. Crank angle sensor 22 outputs a rotation pulse signal POS synchronized with the rotation of a crank shaft 14 of internal combustion engine 1. Air flow sensor 23 outputs a sensing signal corresponding to an intake air flow rate QA of internal combustion engine 1. Water temperature sensor 24 outputs a sensing signal corresponding to a cooling water temperature TW of internal combustion engine 1. Accelerator position sensor 25 outputs a sensing signal corresponding to an accelerator position ACC of internal combustion engine 1.

The cooling water temperature TW represents the temperature of internal combustion engine 1. The accelerator position may be alternatively referred to as a throttle opening degree.

Based on the rotation pulse signal POS outputted by crank angle sensor 22, ECU 21 calculates a rotation speed NE of internal combustion engine 1. Based on the signal outputted by air flow sensor 23, ECU 21 calculates the intake air flow rate QA. Based on the engine rotation speed NE and the intake air flow rate QA, ECU 21 calculates a base injection pulse width TP [ms], in other words, calculates a base fuel injection amount.

Moreover, based on values such as the cooling water temperature TW sensed based on the output from water temperature sensor 24, ECU 21 calculates a correction coefficient CO. ECU 21 corrects the base injection pulse width TP with the correction coefficient CO and the like so as to calculate the injection pulse width TI [ms] corresponding to the fuel injection amount to each cylinder per combustion cycle, in other words, calculate an ultimate fuel injection amount.

Also, based on the injection pulse width TI, ECU 21 determines pulse widths Timain and Tisub (TI=Timain+Tisub) of the injection pulse signals to be outputted respectively to fuel injection valves 11 and 12. ECU 21 outputs the injection pulse signal having the pulse width Timain to first fuel injection valve 11 at its predetermined injection timing, and outputs the injection pulse signal having the pulse width Tisub to second fuel injection valve 12 at its predetermined injection timing. In this way, ECU 21 performs control such that fuel is injected from fuel injection valves 11 and 12 in accordance with the injection pulse signals.

Furthermore, ECU 21 performs control to stop fuel injection from fuel injection valves 11 and 12 while the operational state of internal combustion engine 1 is a predetermined deceleration state. Note that such control will be referred will be referred to as deceleration fuel cut-off control below.

When the operational state of internal combustion engine 1 changes to the deceleration state in which the accelerator is in full-close position, in other words, the throttle is fully closed, and where the engine rotation speed NE is higher than a first threshold NESL1, which is a rotation speed at which fuel cut-off is started, ECU 21 stops fuel injection from fuel injection valves 11 and 12.

When the accelerator is stepped on during the deceleration fuel cut-off state, ECU 21 resumes fuel injection from fuel injection valves 11 and 12. In addition, when the engine rotation speed NE decreases to a second threshold NESL2, which is lower than the first threshold NESL1, during the deceleration fuel cut-off state, ECU 21 resumes fuel injection from fuel injection valves 11 and 12 (see FIG. 3).

Specifically, at the time of resuming fuel injection when the engine rotation speed NE decreases to the second threshold NESL2 during the deceleration fuel cut-off state, ECU 21 activates fuel injection from first fuel injection valve 11 while temporarily stopping fuel injection from second fuel injection valve 12.

In the description below, the injection control mode in which fuel injection from first fuel injection valve 11 is activated while fuel injection from second fuel injection valve 12 is temporarily stopped will be referred to as "single injection mode", and the injection control mode in which fuel injection from both first fuel injection valve 11 and second fuel injection valve 12 is activated will be referred to as "twin injection mode". Normally, fuel injection is controlled in the "twin injection mode".

The deceleration fuel cut-off control and fuel injection resume control will be described in detail below.

FIG. 2 is a flowchart illustrating the flow of the fuel injection control performed by ECU 21.

In step S101, ECU 21 detects whether or not a deceleration fuel cut-off condition (predetermined condition for stopping fuel injection) is satisfied. The deceleration fuel cut-off condition is satisfied when, for example, the throttle valve is fully closed and the engine rotation speed NE is above the first threshold NESL1.

When the deceleration fuel cut-off condition is not satisfied, the operation proceeds to step S104. In step S104, ECU 21 detects whether or not a flag FCUT is on, i.e., whether or not the flag FCUT=1 holds. The flag FCUT is used for determining whether or not it is during recovery after the resumption of fuel injection from the deceleration fuel cut-off state.

The initial value for the flag FCUT is set to 0, and ECU 21 turns on the flag FCUT upon performing the deceleration fuel cut-off, as will be described later.

When ECU 21 detects that the flag FCUT is off, i.e., that the flag FCUT=0 holds in step S104, the operation proceeds to flag reset processing in step S108, and then to step S109. In step S109, ECU 21 performs normal fuel injection control in which fuel is injected using both first fuel injection valve 11 and second fuel injection valve 12.

In the normal fuel injection control in step S109, ECU 21 controls such that fuel is injected from first fuel injection valve 11 and second fuel injection valve 12 in each cycle with a fuel injection allocation ratio between fuel injection valves 11 and 12 fixed, for example, to 50%:50%.

In the normal fuel injection control, ECU 21 may select a mode from a plurality of injection control modes such as an alternate injection mode and a combined injection mode in accordance with operational conditions, such as the engine rotation speed, the engine load, and the cooling water temperature, of internal combustion engine 1, and may control fuel injection from fuel injection valves 11 and 12 in accordance with the selected injection mode.

In the alternate injection mode, fuel is injected to internal combustion engine 1 by alternately driving first fuel injection valve 11 and second fuel injection valve 12 in each preset number of combustion cycles.

In other words, in the alternate injection mode, ECU 21 performs control as follows. Specifically, the full amount of fuel to be injected per cycle (fuel injection amount TI) is injected from either of first fuel injection valve 11 and second fuel injection valve 12 so as to produce an air-fuel mixture having a target air-fuel ratio while injection operation from the other fuel injection valve is temporarily stopped. In addition, the fuel injection valve used for injection of the full amount of fuel is switched between first fuel injection valve 11 and second fuel injection valve 12 every preset number of combustion cycles.

In the combined injection mode, fuel is injected to internal combustion engine 1 by using both first fuel injection valve 11 and second fuel injection valve 12 in each combustion cycle. In the combined injection mode, ECU 21 performs control such that the full amount of fuel to be injected per cycle is divided and allocated between and injected separately from first fuel injection valve 11 and second fuel injection valve 12 so as to produce an air-fuel mixture having a target air-fuel ratio.

In the combined injection mode, ECU 21 may variably set the fuel injection allocation ratio between first fuel injection valve 11 and second fuel injection valve 12 in accordance with engine operational conditions such as the engine load, the engine rotation speed, the engine temperature, and the start-up state. Furthermore, in the combined injection mode, ECU 21 may temporarily stop injection operation of either of first fuel injection valve 11 and second fuel injection valve 12 by setting the allocation ratio of the fuel injection valve to 0% when a predetermined engine operational condition is satisfied.

In the combined injection mode, ECU 21 may perform control such that fuel is injected from first fuel injection valve 11 at the same timing as fuel is injected from second fuel injection valve 12. Alternatively, ECU 21 may perform control such that fuel is injected from first fuel injection valve 11 at timing different from timing at which fuel is injected from second fuel injection valve 12 by independently setting the injection timing of first fuel injection valve 11 and the injection timing of second fuel injection valve 12.

When ECU 21 detects that the condition for performing the deceleration fuel cut-off control is satisfied in step S101, the operation proceeds to step S102. In step S102, ECU 21 turns on the flag FCUT, i.e., sets the flag FCUT to 1. After that, the operation proceeds to step S103.

In step S103, ECU 21 stops fuel injection from first fuel injection valve 11 and second fuel injection valve 12 so as to activate the deceleration fuel cut-off state in which fuel injection to each cylinder is stopped.

When the accelerator pedal is stepped on during the deceleration fuel cut-off state, the deceleration fuel cut-off condition becomes no longer satisfied. Also, the deceleration fuel cut-off condition becomes no longer satisfied when the engine rotation speed NE decreases to the second threshold NESL2 during the deceleration fuel cut-off state.

When ECU 21 detects that the deceleration fuel cut-off condition has become no longer satisfied in step S101, the operation proceeds to step S104.

In response to the determination that the deceleration fuel cut-off condition has become no longer satisfied, the flag FCUT is turned on. Thus, when the operation proceeds to step S104 after such determination, ECU 21 detects that the flag FCUT=1 holds in step S104, and the operation thus proceeds to step S105.

In step S105, ECU 21 detects whether or not the reason why the deceleration fuel cut-off condition has become no longer satisfied is that the engine rotation speed NE decreases to the second threshold NESL2 during the deceleration fuel cut-off state.

When the reason why the deceleration fuel cut-off condition has become no longer satisfied is that the driver steps on the accelerator pedal so as to open the throttle during the deceleration fuel cut-off state, in other words, when the deceleration fuel cut-off condition has become no longer satisfied along with the transition from deceleration driving to acceleration driving, the operation proceeds from step S105 to step S108. In step S108, ECU 21 turns off the flag FCUT, i.e., sets the flag FCUT to 0, and the operation then proceeds to step S109. In step S109, ECU 21 performs the normal fuel injection control in which fuel is injected using both first fuel injection valve 11 and second fuel injection valve 12.

In other words, when resuming fuel injection in response to acceleration of internal combustion engine 1 during the deceleration fuel cut-off state, ECU 21 performs control such that fuel is injected from both fuel injection valves 11 and 12 from the initial moment of the resumption. This is because when fuel injection is resumed in response to acceleration, an intake air amount increases so much that the fuel injection amount TI becomes large enough to allow fuel to be injected from each of fuel injection valves 11 and 12 in an amount corresponding to an injection pulse width equal to or greater than the minimum pulse width Ti2min.

On the other hand, when ECU 21 detects that the reason why the deceleration fuel cut-off condition has become no longer satisfied is that the engine rotation speed NE decreases to the second threshold NESL2, the operation proceeds to step S106.

In step S106, ECU 21 detects whether or not switching timing at which ECU 21 returns to the normal fuel injection control, i.e., the injection control in the twin injection mode, has come after the deceleration fuel cut-off condition becomes no longer satisfied. When ECU 21 detects that it is currently during a period from when the engine rotation speed NE decreases to the second threshold NESL2 to the switching timing, the operation proceeds to step S107.

In step S107, ECU 21 activates fuel injection from first fuel injection valve 11 while temporarily stopping fuel injection from second fuel injection valve 12.

In other words, when the operation proceeds to step S107, ECU 21 sets the injection pulse width Timain of first fuel injection valve 11 to TI while setting the injection pulse width Tisub of second fuel injection valve 12 to 0 [ms]. In this way, ECU 21 performs control such that the full injection amount TI of fuel per cylinder is injected from first fuel injection valve 11.

In step S106, when ECU 21 detects that the switching timing has come while the full injection amount TI of fuel per cylinder is injected from first fuel injection valve 11 and while fuel injection from second fuel injection valve 12 is temporarily stopped, the operation proceeds to step S108. In step S108, ECU 21 resets the flag FCUT to 0, and the operation then proceeds to step S109. In step S109, ECU 21 switches from the fuel injection control in the single injection mode to the normal fuel injection control in the twin injection mode.

In other words, when the deceleration fuel cut-off condition becomes no longer satisfied due to a decrease in the engine rotation speed NE, ECU 21 resumes fuel injection in the single injection mode where fuel is injected only from first fuel injection valve 11. After continuing to perform injection control in the single injection mode for a predetermined period, ECU 21 switches the injection control to the twin injection mode where fuel is injected from both first fuel injection valve 11 and second fuel injection valve 12.

Below will be described advantageous effects of activating fuel injection from fuel injection valve 11 while temporarily stopping fuel injection from fuel injection valve 12 at the time of resuming fuel injection after the deceleration fuel cut-off condition becomes no longer satisfied due to a decrease in the engine rotation speed NE.

The amount to be injected to each cylinder per cycle is small when the deceleration fuel cut-off condition becomes no longer satisfied due to a decrease in the engine rotation speed NE.

Accordingly, when such a small amount of fuel is divided and allocated between and injected separately from first fuel injection valve 11 and second fuel injection valve 12, the fuel injection amount from each of fuel injection valves 11 and 12 may possibly be excessively small, so that the injection pulse width allocated to each of fuel injection valves 11 and 12 may possibly be below the minimum pulse width Ti2min. This might lead to a large gap between the indicated value and the actual value of the fuel injection amount.

In other words, the minimum injection amount of fuel that can be divided and allocated between and injected separately from two fuel injection valves 11 and 12 corresponds to the injection pulse width that satisfies the conditions where the injection pulse width Timain of first fuel injection valve 11 is equal to Ti2min, and where the injection pulse width Tisub of second fuel injection valve 12 is equal to Ti2min, i.e., corresponds to the injection pulse width equal to Ti2min×2. When the injection pulse width TI falls below Ti2min×2, the injection pulse widths Timain and Tisub of fuel injection valves 11 and 12 also fall below the minimum pulse width Ti2min. This reduces the accuracy of fuel measurement, thus leading to an error in the air-fuel ratio.

As described above, if fuel injection is resumed from both first fuel injection valve 11 and second fuel injection valve 12 after the deceleration fuel cut-off condition becomes no longer satisfied due to a decrease in the engine rotation speed NE, the resumption of the fuel injection may be permitted when the engine rotation speed remains high such that the injection pulse width TI calculated at that time remains equal to or greater than Ti2min×2. In such case, if fuel injection is resumed after the engine rotation speed becomes low such that the injection pulse width TI will fall below Ti2min×2, an error will be observed in the air-fuel ratio, which might lead to deterioration in combustion stability and in exhaust gas properties.

In contrast, when fuel injection is resumed from first fuel injection valve 11 while second fuel injection valve 12 is temporarily stopped after the deceleration fuel cut-off condition becomes no longer satisfied due to a decrease in the engine rotation speed NE, the resumption of the fuel injection may be permitted as long as the injection pulse width TI is above Ti2min. Even under such conditions, fuel can be injected with sufficient measurement accuracy and thus an error in the air-fuel ratio can be prevented since the injection pulse width Timain of first fuel injection valve 11 is equal to the injection pulse width TI in such case.

In other words, after the deceleration fuel cut-off condition becomes no longer satisfied due to a decrease in the engine rotation speed NE, the resumption of the fuel injection may be permitted when the injection pulse width TI becomes smaller, in other words, when the engine rotation speed NE becomes even lower in the case where fuel injection is resumed from first fuel injection valve 11 while second fuel injection valve 12 is temporarily stopped than in the case where fuel injection is resumed from both first fuel injection valve 11 and second fuel injection valve 12.

Permitting the resumption of the fuel injection at a lower engine rotation speed makes the fuel cut-off period longer, and thus improves fuel economy of internal combustion engine 1 more.

FIG. 3 is a time chart illustrating how fuel is injected from first fuel injection valve 11 and second fuel injection valve 12 while ECU 21 performs the deceleration fuel cut-off control and the fuel injection resume control.

In FIG. 3, in a period from time point t0 to time point t1, during which the throttle valve is open, ECU 21 performs the normal fuel injection control such that fuel is injected from both first fuel injection valve 11 and second fuel injection valve 12.

Then, at time point t1 when the throttle valve is fully closed and thus the condition for performing the deceleration fuel cut-off is satisfied, ECU 21 stops fuel injection from first fuel injection valve 11 and second fuel injection valve 12 so as to transition to the deceleration fuel cut-off state in which no fuel is injected to each cylinder.

During the deceleration fuel cut-off state, the engine rotation speed NE decreases. Then, at time point t3 when the engine rotation speed NE reaches the second threshold NESL2, the deceleration fuel cut-off condition becomes no longer satisfied, and ECU 21 resumes fuel injection to each cylinder. Specifically, in this event, ECU 21 resumes fuel injection by using only first fuel injection valve 11 among two fuel injection valves 11 and 12 while temporarily stopping fuel injection from second fuel injection valve 12.

Here, as described above, if ECU 21 is configured to control such that fuel is injected from both first fuel injection valve 11 and second fuel injection valve 12 at the resumption of fuel injection from the deceleration fuel cut-off state, the resumption of the fuel injection may be permitted when the injection pulse width TI remains equal to or greater than twice the minimum pulse width Ti2min, in other words, when the engine rotation speed NE remains a third threshold NESL3 (NESL3>NESL2) or more.

In contrast, when ECU 21 is configured to control such that fuel is injected from first fuel injection valve 11 while second fuel injection valve 12 is temporarily stopped at the resumption of fuel injection from the deceleration fuel cut-off state, the resumption of the fuel injection may be permitted as long as the injection pulse width TI is equal to or greater than the minimum pulse width Ti2min. This means that the resumption of the fuel injection can be delayed till the engine rotation speed decreases to the second threshold NESL2, which is lower than the threshold which would be employed if fuel injection is resumed in the twin injection mode.

In other words, by causing ECU 21 to perform control such that fuel is injected from single fuel injection valve 11 at the resumption of fuel injection from the deceleration fuel cut-off state, fuel injection can be resumed at a lower engine rotation speed NE, which means that the resumption of fuel injection is delayed, and thus makes the deceleration fuel cut-off period longer.

Furthermore, the longer the deceleration fuel cut-off period is, the greater amount of fuel is cut in total by the fuel injection stop in the fuel cut-off period. As a result, more fuel is saved by the fuel cut-off.

Comparing the single injection mode in which fuel is injected from single fuel injection valve 11 with the twin injection mode in which fuel is injected from both fuel injection valves 11 and 12, the minimum injection amount Timin, which is a minimum allowable injection amount to each cylinder that ensures to maintain the measurement accuracy, is set lower in the single injection mode than in the twin injection mode.

Figure 4:
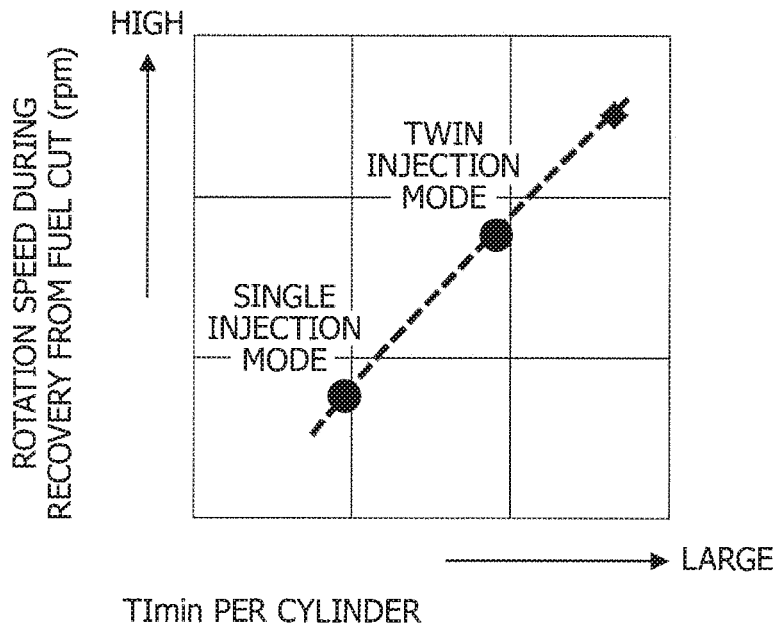
FIG. 4 is a graph that exemplifies the relationship between the minimum injection pulse width per cylinder and the engine rotation speed at which fuel injection is resumed, according to an embodiment of the present invention.

Meanwhile, during the deceleration fuel cut-off state, the lower the engine rotation speed NE is, the smaller the fuel injection amount TI at the resumption of fuel injection is. Thus, as illustrated in FIG. 4, the smaller minimum injection amount Timin allows the resumption of fuel injection at a lower engine rotation speed.

Figure 5:
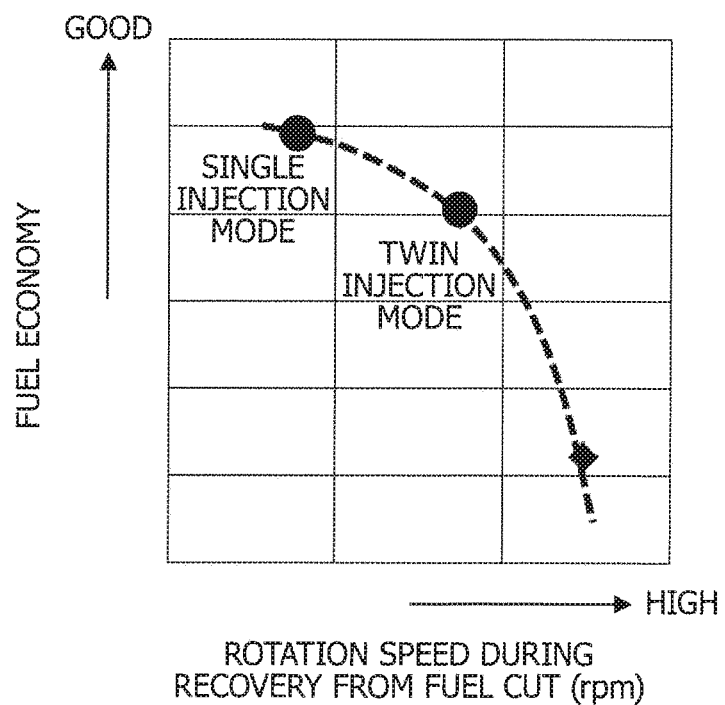
FIG. 5 is a graph that exemplifies the relationship between fuel economy improvement and the engine rotation speed at which fuel injection is resumed, according to an embodiment of the present invention.
Figure 6:
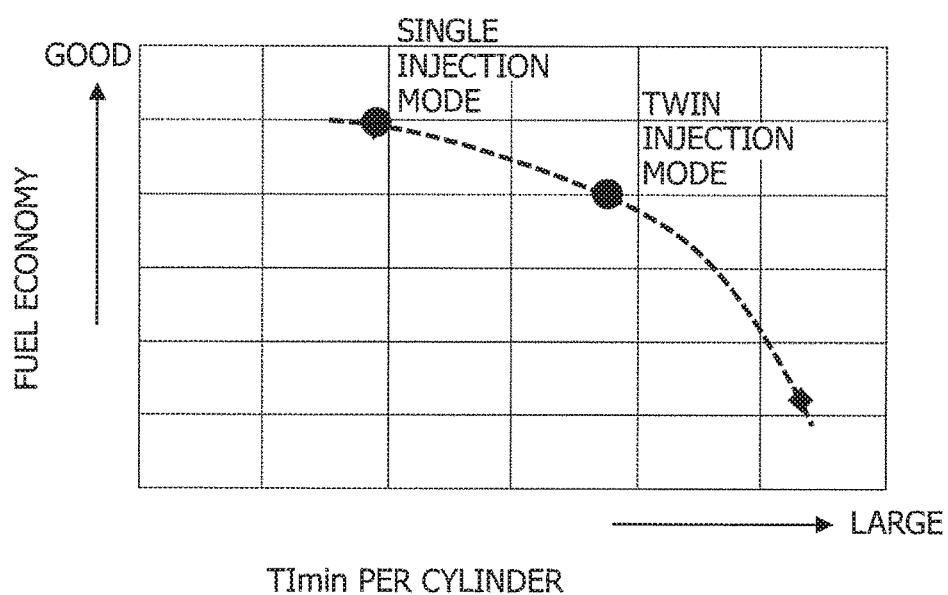
FIG. 6 is a graph that exemplifies the relationship between fuel economy improvement and the minimum injection pulse width per cylinder, according to an embodiment of the present invention.

Resuming fuel injection at a lower engine rotation speed makes the deceleration fuel cut-off period longer, thus improving fuel economy more, as illustrated in FIG. 5. In other words, since the minimum injection amount Timin is set smaller in the single injection mode than in the twin injection mode, fuel economy is more improved when fuel injection is resumed under control in the single injection mode than when fuel injection is resumed in the twin injection mode as illustrated in FIG. 6.

Figure 7:
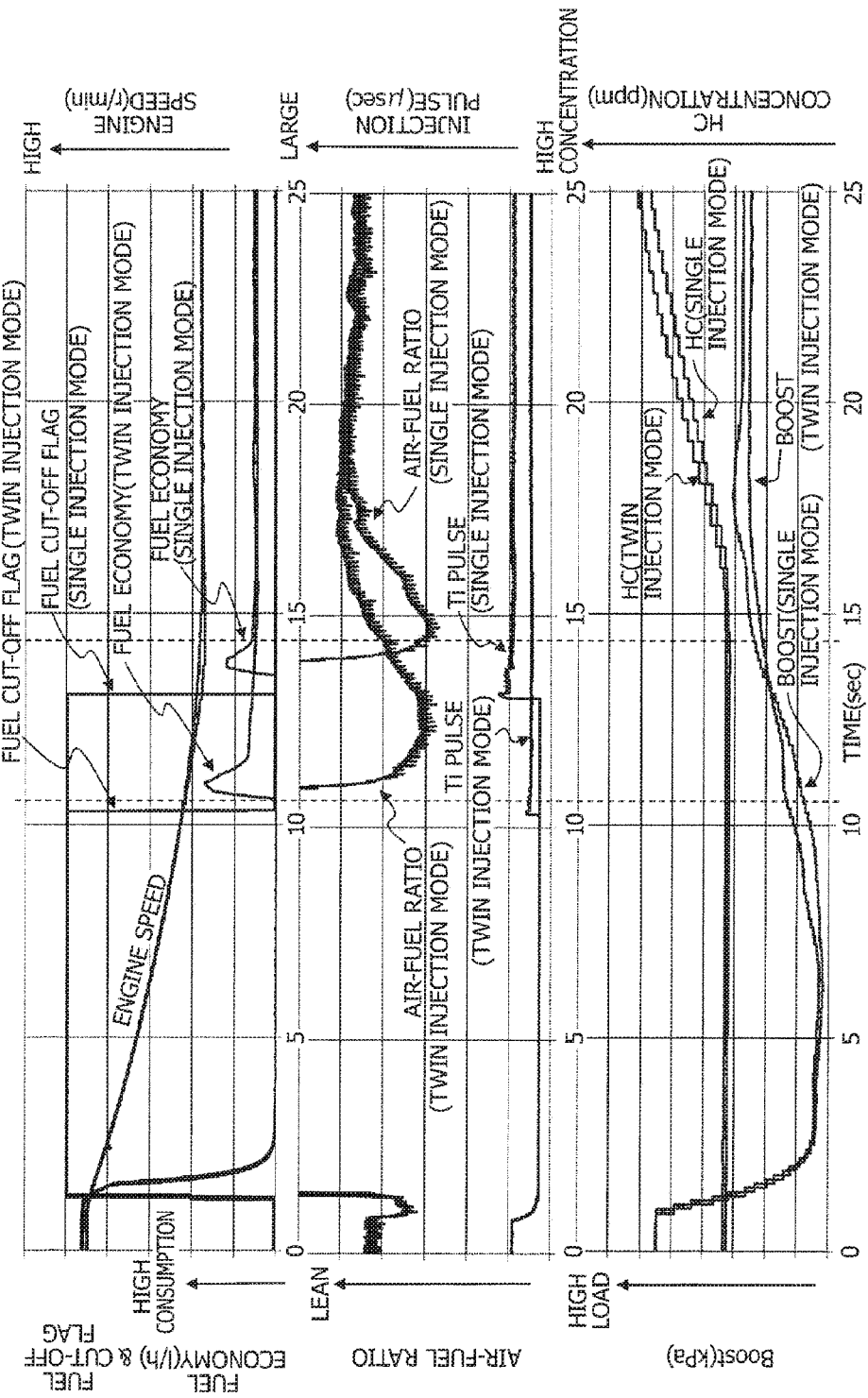
FIG. 7 is a time chart exemplifying changes in fuel economy, the concentration of unburned components, the air-fuel ratio, and the like at the resumption of fuel injection from the state in which deceleration fuel cut-off is active, according to an embodiment of the present invention.

FIG. 7 is a time chart illustrating changes in the concentration of unburned components and in fuel economy due to the deceleration fuel cut-off control. Comparing the single injection mode, in which fuel is injected from first fuel injection valve 11 while fuel injection from second fuel injection valve 12 is temporarily stopped, with the twin injection mode, in which fuel is injected from first fuel injection valve 11 and second fuel injection valve 12, fuel economy is more improved when fuel injection is resumed in the single injection mode than when fuel injection is resumed in the twin injection mode at the resumption of fuel injection from the deceleration fuel cut-off state. Meanwhile, injecting fuel only from first fuel injection valve 11 has a sufficiently small impact on air-fuel mixture production, and can maintain the concentration of unburned components at a level comparable to that in the twin injection mode.

Assume here that the minimum pulse width Ti2min of each of fuel injection valves 11 and 12 is smaller. In such case, even if ECU 21 is configured to resume fuel injection by using both fuel injection valves 11 and 12, the resumption of fuel injection can be permitted at a lower engine rotation speed. However, reducing the minimum pulse width Ti2min increases the costs of fuel injection valves 11 and 12, and also reduces the static fuel injection amount, resulting in an insufficient fuel flow rate in a high load range of the internal combustion engine.

In contrast, when ECU 21 is configured to control such that fuel can be injected by using either of two fuel injection valves 11 and 12, the injection amount of fuel injection valve 11 is increased as compared to when fuel is injected by using two fuel injection valves 11 and 12 during the same engine operational state, so that fuel injection can be performed in a range where measurement accuracy is not deteriorated.

Thus, configuring ECU 21 to resume fuel injection in the single injection mode allows ECU 21 to resume fuel injection at a lower engine rotation speed without using any high cost injection valve having a smaller minimum pulse width Ti2min, and to prevent an insufficient fuel flow rate in a high load range of the internal combustion engine.

Moreover, ECU 21 is configured to control such that fuel is injected from first fuel injection valve 11 while second fuel injection valve 12 is temporarily stopped at the resumption of fuel injection after the deceleration fuel cut-off condition becomes no longer satisfied due to a decrease in the engine rotation speed, and configured to control such that, under operational conditions other than above, fuel is injected by using both fuel injection valves 11 and 12 in a mode such as the combined injection mode or the alternate injection mode. This makes it possible to provide advantageous effects that would not be provided by fuel injection from single fuel injection valve 11.

Such advantageous effects are as follows. The combined injection mode reduces injection time from each of fuel injection valves 11 and 12 while increasing vaporization time for fuel, thus allowing for homogeneous air-fuel mixture production. The alternate injection mode increases time from when either of first fuel injection valve 11 and second fuel injection valve 12 injects fuel until when the fuel injection valve injects fuel the next time, thus increasing vaporization time for wall-adhered fuel. Accordingly, the alternate injection mode reduces an equilibrium adsorption amount of fuel on the inner wall of the intake passage as compared to the combined injection mode.

Note that the wall-adhered fuel used herein refers to fuel adhering onto the inner walls of intake ports 3 and 4 in the form of liquid.

Furthermore, by switching between the combined injection mode and the alternate injection mode as described above in accordance with the operational conditions of internal combustion engine 1 such as the engine temperature, the engine load, and the engine rotation speed, ECU 21 is capable of reducing deterioration in exhaust gas properties due to an increase in wall-adhered fuel during an engine cold state, as well as producing a homogeneous air-fuel mixture after the warm-up of internal combustion engine 1.

In step S106, ECU 21 may detect that the switching timing has come, for example, when a predetermined time passes from the time point when the deceleration fuel cut-off condition becomes no longer satisfied, or when the number of accumulated injections after the resumption of fuel injection reaches a predetermined value.

Here, the predetermined time and the predetermined value for the number of accumulated injections, which are used for determining whether the switching timing has come, are adapted in advance through experiments and the like so as to allow determination of a period of time that it is expected to take for the injection pulse width TI to become equal to or greater than Ti2min×2 along with an increase in the injection pulse width TI after the resumption of fuel injection.

Alternatively, ECU 21 may detect that the switching timing has come based on comparison between the injection pulse width TI and the minimum pulse width Ti2min.

Specifically, ECU 21 may switch from the single injection mode to the twin injection mode at timing when the injection pulse width TI per cycle is increased so much that even if the injection pulse width TI per cycle is divided and allocated to two fuel injection valves 11 and 12, each of the allocated injection pulse widths Timain and Tisub of fuel injection valves 11 and 12 becomes equal to or greater than the minimum pulse width Ti2min.

Figure 8:
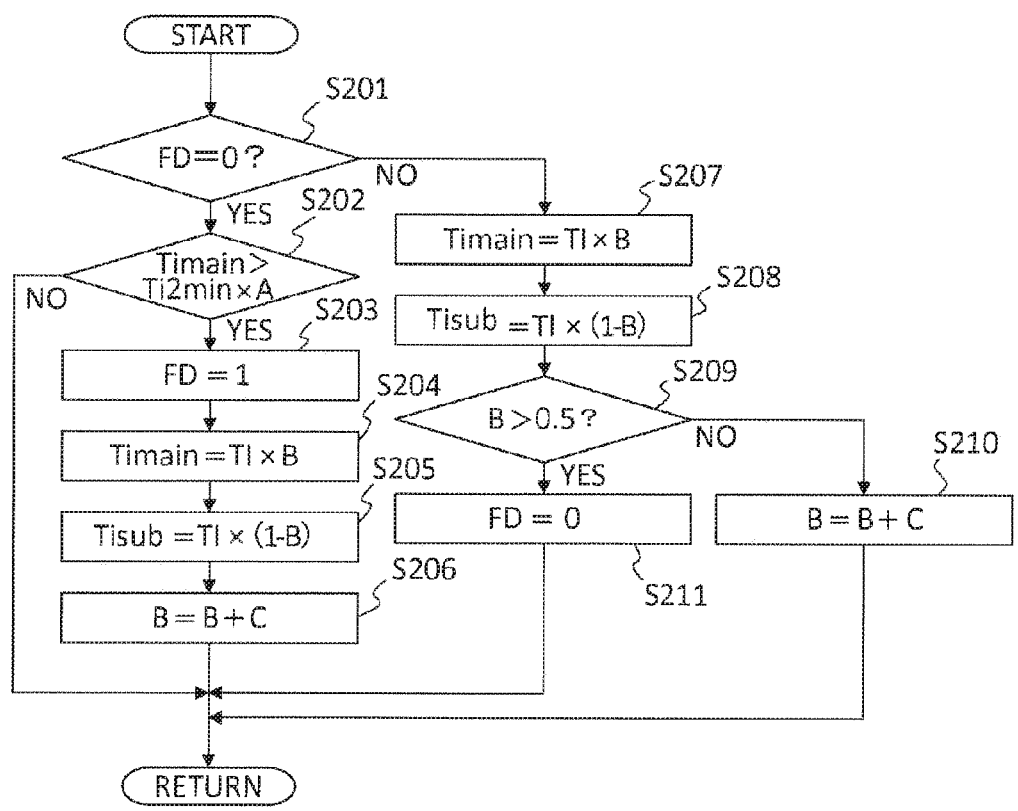
FIG. 8 is a flowchart illustrating allocation ratio control at the resumption of fuel injection from the state in which deceleration fuel cut-off is active, according to an embodiment of the present invention.

FIG. 8 is a flowchart illustrating an example of the control for switching from the single injection mode to the twin injection mode based on comparison between the minimum pulse width Ti2min and the injection pulse width TI.

ECU 21 performs, as interrupt processing, the routine illustrated in the flowchart of FIG. 8 at a constant frequency during fuel injection in the single injection mode which is resumed from the deceleration fuel cut-off state in response to a decrease in the engine rotation speed.

First, in step S201, ECU 21 detects whether or not an injection allocation flag FD is 0.

As will be described later, ECU 21 is configured to perform the switching control illustrated in the flowchart of FIG. 8 as follows. Specifically, in a predetermined period immediately after the switching from the single injection mode, in which fuel is injected from first fuel injection valve 11 while fuel injection from second fuel injection valve 12 is temporarily stopped, to the twin injection mode, in which fuel is injected by using first fuel injection valve 11 and second fuel injection valve 12, ECU 21 gradually changes the fuel injection allocation ratio between fuel injection valves 11 and 12. Based on the injection allocation flag FD, ECU 21 detects whether or not processing for changing the allocation ratio is currently performed.

The initial value for the injection allocation flag FD is 0.

When ECU 21 detects that the injection allocation flag FD is 0, in other words, that the full fuel injection amount TI to each cylinder per cycle is injected from first fuel injection valve 11 while fuel injection from second fuel injection valve 12 is temporarily stopped, the operation proceeds to step S202.

In step S202, ECU 21 detects whether or not the pulse width Timain of the injection pulse signal outputted to first fuel injection valve 11 in the single injection mode, in other words, the total fuel injection amount to each cylinder per cycle, is above the A-fold ($2 \leq A$) of the minimum pulse width Ti2min of each of fuel injection valves 11 and 12.

In other words, in step S202, ECU 21 detects whether or not the injection pulse width of each of fuel injection valves 11 and 12 is above the minimum pulse width Ti2min even after ECU 21 switches from the single injection mode to the twin injection mode.

In the single injection mode, in which fuel injection from second fuel injection valve 12 is temporarily stopped, the pulse width Timain of first fuel injection valve 11 is equal to the injection pulse width TI. On the other hand, in the twin injection mode, in which fuel is injected from both first fuel injection valve 11 and second fuel injection valve 12, the sum of the pulse width Timain of first fuel injection valve 11 and the pulse width Tisub of second fuel injection valve 12 is equal to the injection pulse width TI.

As described above, the minimum pulse width Ti2min is a minimum value at which the measurement accuracy of each of fuel injection valves 11 and 12 is above the allowable lower limit.

Under the operational condition in which fuel of an amount per cycle corresponding to twice the minimum pulse width Ti2min is injected to each cylinder, and when the fuel injection amount from fuel injection valve 11 is set equal to that from fuel injection valve 12, the fuel injection amount from each of fuel injection valves 11 and 12 corresponds to the minimum pulse width Ti2min, assuring that each of fuel injection valves 11 and 12 can inject fuel with sufficient measurement accuracy.

Accordingly, it is assured that each of fuel injection valves 11 and 12 can inject fuel with the minimum measurement accuracy or more when the following operational conditions are satisfied: fuel of an amount per cycle corresponding to at least twice the minimum pulse width Ti2min is injected to each cylinder; and the injection pulse width Timain of first fuel injection valve 11 is Ti2min or more, and the injection pulse width Tisub of second fuel injection valve 12 is Ti2min or more.

Thus, ECU 21 transitions the injection control to the twin injection mode using both first fuel injection valve 11 and second fuel injection valve 12 only after ECU 21 detects that the pulse width Timain of the injection pulse signal outputted to first fuel injection valve 11, in other words, the fuel injection amount TI to each cylinder per cycle, becomes equal to or greater than twice the minimum pulse width Ti2min in step S202.

This prevents the switching from the single injection mode to the twin injection mode from being performed while at least either of the pulse widths Timain and Tisub of fuel injection valves 11 and 12 is below the minimum pulse width Ti2min. Thus, a drop in control accuracy of air-fuel ratio can be curbed or prevented after the switching to the twin injection mode.

Note that even if the fuel injection amount from fuel injection valve 11 is set equal to that from fuel injection valve 12 in the twin injection mode, ECU 21 may switches to the twin injection mode only when the fuel injection amount to each cylinder per cycle is above twice the minimum pulse width Ti2min, in consideration of variation in Ti2min.

When ECU 21 detects that the pulse width Timain of the injection pulse signal outputted to first fuel injection valve 11 is equal to or below the A-fold of the minimum pulse width Ti2min, this routine ends immediately. In this way, ECU 21 continues the single injection mode, in which the full amount to be injected per cycle of fuel is injected from first fuel injection valve 11 while fuel injection from second fuel injection valve 12 is temporarily stopped.

When ECU 21 detects that the pulse width Timain of the injection pulse signal outputted to first fuel injection valve 11 is above the A-fold of the minimum pulse width Ti2min, the operation proceeds to step S203. In step S203, ECU 21 sets the injection allocation flag FD to 1, thus switching to transitional control. In the transitional control, ECU 21 activates fuel injection by using both first fuel injection valve 11 and second fuel injection valve 12 while gradually changing the fuel injection allocation ratio between fuel injection valves 11 and 12.

The timing at which the injection allocation flag FD is switched from 0 to 1 corresponds to the switching timing at which the operation proceeds from step S106 to step S108 in the flowchart of FIG. 2. After completing the transitional control of gradually changing the allocation ratio, ECU 21 starts the normal fuel injection control.

In other words, the injection control with the allocation ratio gradually changed is transitionally performed when ECU 21 switches from the single injection mode, in which fuel is injected by using only first fuel injection valve 11, to the twin injection mode, in which fuel is injected by using both first fuel injection valve 11 and second fuel injection valve 12.

When ECU 21 sets the injection allocation flag FD to 1 in step S203, the operation proceeds to steps S204 and S205, in which ECU 21 determines the injection pulse widths Timain and Tisub of fuel injection valves 11 and 12.

Specifically, in step S204, ECU 21 sets the injection pulse width Timain of first fuel injection valve 11 to TI×B, where B is a coefficient.

In addition, in step S205, ECU 21 sets the injection pulse width Tisub of second fuel injection valve 12 to TI×(1−B) such that TI=Timain+Tisub holds.

The initial value for the coefficient B is set greater than 0 but smaller than 0.5 (0<the initial value for the coefficient B<0.5), and may be set, for example, to 0.4 (40%).

With the coefficient B, the injection amount of first fuel injection valve 11 is set larger than injection amount of second fuel injection valve 12 immediately after the switching to the twin injection mode using both first fuel injection valve 11 and second fuel injection valve 12.

Immediately after switching to the twin injection mode using both first fuel injection valve 11 and second fuel injection valve 12, ECU 21 sets the allocation ratio of second fuel injection valve 12, which has been temporarily stopped, higher than 50% while setting the allocation ratio of first fuel injection valve 11, from which fuel has been and continues to be injected, lower than 50%, instead of allocating 50% of the injection pulse width TI to first fuel injection valve 11 while allocating the remaining 50% to second fuel injection valve 12.

The initial value for the coefficient B is previously adjusted such that, when fuel injection from second fuel injection valve 12 is started with the injection pulse width TI calculated depending on the coefficient A, the injection pulse width Timain of first fuel injection valve 11 does not fall below the minimum pulse width Ti2min calculated depending on the initial value for the coefficient B.

For example, when the initial value for the coefficient B is set to 40%, the injection pulse width TI calculated depending on the coefficient A at the start of injection from second fuel injection valve 12 is adjusted such that Timain=TI×40% is equal to or greater than the minimum pulse width Ti2min.

The injection pulse width TI at the start of injection from second fuel injection valve 12 is expressed by TI=Ti2min× 2.5 where Timain=TI×40%=Ti2min. In other words, when the initial value for the coefficient B is set to 40%, it is necessary to set the coefficient A to 2.5 or more in order to set the injection pulse width Timain of first fuel injection valve 11 to the minimum pulse width Ti2min or more while setting the injection pulse width Tisub of second fuel injection valve 12 greater than the minimum pulse width Ti2min.

Then, the operation proceeds to step S206, in which ECU 21 increases the coefficient B that defines the allocation ratio between fuel injection valves 11 and 12 by a predetermined value C. In this way, ECU 21 increases the allocation ratio of first fuel injection valve 11 from below 50% to bring it to 50%, while reducing the allocation ratio of second fuel injection valve 12 from above 50% to bring it to 50%.

By performing this processing for updating the coefficient B, ECU 21 gradually increases the fuel injection amount from first fuel injection valve 11 from below TI/2 to bring it to TI/2 while gradually reducing the fuel injection amount from second fuel injection valve 12 from above TI/2 to bring it to TI/2.

In step S201, when ECU 21 detects that the injection allocation flag FD is 1, in other words, that, fuel injection has been switched from the single injection mode to the twin injection mode, the operation proceeds to step S207.

In step S207, based on the coefficient B updated at the previous execution of this routine, ECU 21 calculates the injection pulse width Timain of first fuel injection valve 11 (Timain=TI×B).

In the next step S208, based on the coefficient B updated at the previous execution of this routine, ECU 21 calculates the injection pulse width Tisub of second fuel injection valve 12 (Tisub=TI×(1−B)).

The operation then proceeds to step S209, in which ECU 21 detects whether or not the coefficient B has been increased to be greater than 0.5 (50%).

While the coefficient B is lower than or equal to 0.5, in other words, during a transitional state in which the allocation ratio is getting closer to 50%, the operation proceeds to step S210. In step S210, ECU 21 performs the processing for updating the coefficient B by increasing it by the predetermined value C. Until the allocation ratio reaches 50%, the processing from steps S207 to S210 is repeated.

When ECU 21 detects that the coefficient B is greater than 0.5 in step S209, the operation proceeds to step S211. In step S211, ECU 21 resets the injection allocation flag FD to 0, and ends the allocation ratio control according to this routine. After that, ECU 21 performs the normal fuel injection control in step S109.

Figure 9:
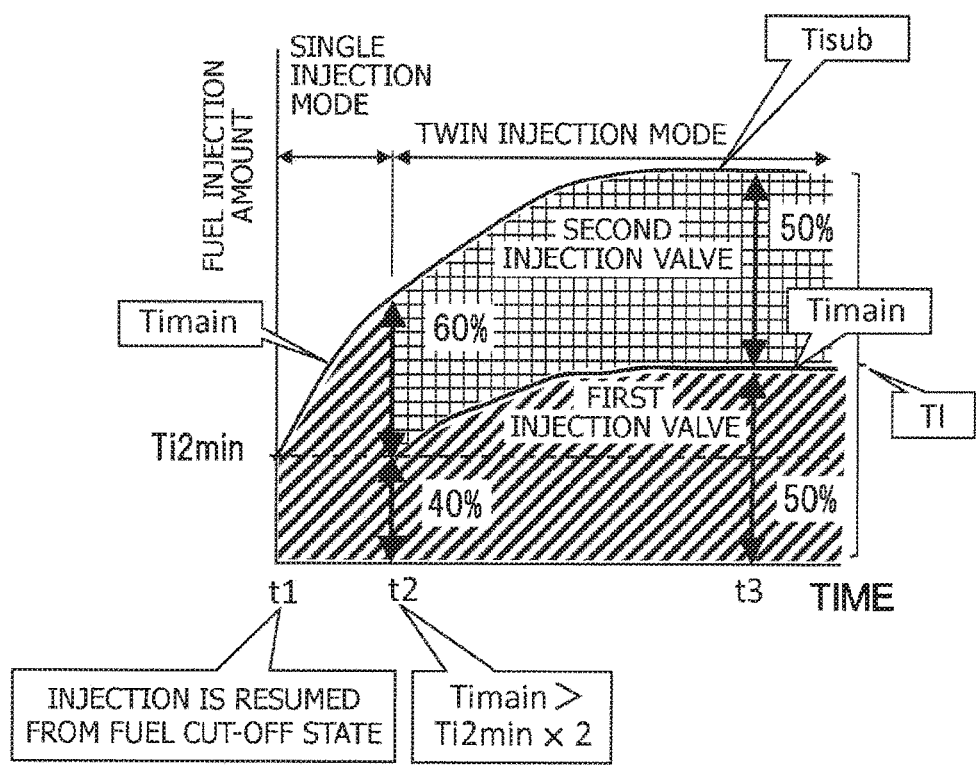
FIG. 9 is a time chart exemplifying a change pattern in the allocation ratio, according to an embodiment of the present invention.

FIG. 9 is a time chart illustrating an example of changes in the allocation ratio between fuel injection valves 11 and 12 while the allocation ratio control illustrated in the flowchart of FIG. 8 is performed.

In the example illustrated in FIG. 9, at time point t1, when fuel injection is resumed from the deceleration fuel cut-off state, ECU 21 first sets the allocation ratio of first fuel injection valve 11 to 100%, thus causing fuel injection corresponding to the fuel injection pulse width TI from first fuel injection valve 11.

In this event, the engine rotation speed NESL2 for determining whether to resume fuel injection is set such that the injection pulse width Timain of first fuel injection valve 11 immediately after the resumption of fuel injection can be equal to or greater than the minimum pulse width Ti2min. Specifically, in order to ensure that the injection pulse width Timain of first fuel injection valve 11 immediately after the resumption of fuel injection is the minimum pulse width Ti2min or more, the engine rotation speed NESL2 may be set higher than an average engine rotation speed that makes the injection pulse width TI equal to the minimum pulse width Ti2min.

At time point t2, ECU 21 detects that the pulse width Timain is above the A-fold of the minimum pulse width Ti2min. In response, ECU 21 activates fuel injection from both fuel injection valves 11 and 12 with the allocation ratio of first fuel injection valve 11 set at 40% and with the allocation ratio of second fuel injection valve 12 set at 60%.

Here, the coefficient A is adapted such that 40% of the fuel injection pulse width TI at time point t2 corresponds to the minimum pulse width Ti2min, and first fuel injection valve 11 injects fuel with this minimum pulse width Ti2min at time point t2.

After that, ECU 21 gradually increases the allocation ratio of first fuel injection valve 11 from 40% while gradually reducing the allocation ratio of second fuel injection valve 12 from 60%. In this way, ECU 21 changes the allocation ratio from 40%:60% to 50%:50% over the period from time point t2 to time point t3.

The switching control described above can prevent fuel injection from both fuel injection valves 11 and 12 from being started under the condition where the deterioration in the measurement accuracy of each of fuel injection valves 11 and 12 is expected, thus preventing an error in the air-fuel ratio.

Furthermore, setting the allocation ratio of second fuel injection valve 12, which has been temporarily stopped, greater than 50% at the start of fuel injection from second fuel injection valve 12 prevents a large difference between the fuel amounts taken in through the respective intake ports to each cylinder, which contributes homogeneous air-fuel mixture production.

At the time when fuel injection from second fuel injection valve 12 is resumed with a delay from first fuel injection valve 11, a smaller amount of wall-adhered fuel remains on second intake port 4 through which second fuel injection valve 12 injects fuel. Accordingly, the amount of gaseous fuel vaporized from such wall-adhered fuel on second intake port 4 and taken in each cylinder is smaller. In addition, such delay increases the proportion of fuel that adheres onto the wall surface of second intake port 4 while reducing the proportion of fuel that is taken in each cylinder in relative to the total fuel injection amount from second fuel injection valve 12.

Thus, if the allocation ratio of each of fuel injection valves 11 and 12 is set to 50% at the time of switching from the single injection mode to the twin injection mode, the fuel amount supplied to each cylinder through second intake port 4 on which second fuel injection valve 12 is disposed will be smaller than the fuel amount supplied to each cylinder through first intake port 3 on which first fuel injection valve 11 is disposed. As a result, a less homogeneous air-fuel mixture will be produced in the cylinders.

To avoid this, ECU 21 sets the injection amount from second fuel injection valve 12 larger than the injection amount from first fuel injection valve at the time of switching from the single injection mode to the twin injection mode. This reduces a difference between the fuel amount supplied through first intake port 3 to each cylinder and the fuel amount supplied through second intake port 4 to each cylinder, so that a more homogeneous air-fuel mixture is produced in the cylinders.

In other words, the initial value for the coefficient B, and the predetermined value C, which defines the speed of the change in the fuel injection allocation ratio, are adapted in advance so as to reduce a difference between the fuel amounts taken through respective intake ports 3 and 4 into each cylinder at the time of switching from the mode where fuel is injected from only first fuel injection valve 11 to the mode where fuel is injected from both fuel injection valves 11 and 12.

Since the injection pulse width Timain of first fuel injection valve 11 calculated depending on the initial value for the coefficient B has to be equal to or greater than the minimum pulse width Ti2min, when the initial value for the coefficient B is smaller than 50%, the injection pulse width TI is set accordingly greater at the start of fuel injection from second fuel injection valve 12, which means that the switching to the twin injection mode is delayed more. However, as described above, setting the initial value for the coefficient B smaller than 50% in turn allows for more homogeneous air-fuel mixture production at the time of switching to the twin injection mode.

Here, ECU 21 may variably set at least either of the predetermined value C and the initial value for the coefficient B in accordance with engine operational conditions that will affect the amount and vaporization characteristics of wall-adhered fuel. Such engine operational conditions include the engine temperature, and the duration of the deceleration fuel cut-off.

For example, ECU 21 may set the initial value for the coefficient B smaller, and/or set the predetermined value C smaller during an engine cold state in which the amount of wall-adhered fuel increases. Moreover, ECU 21 may set the initial value for the coefficient B smaller, and/or set the predetermined value C smaller as the duration of the deceleration fuel cut-off is longer so that wall-adhered fuel on intake port 4 is reduced by a greater amount during the fuel cut-off.

ECU 21 may be configured to cause fuel injection from each of fuel injection valves 11 and 12 at the allocation ratio of 50% from the very start of fuel injection from both fuel injection valves 11 and 12 when the pulse width Timain of the injection pulse signal outputted to first fuel injection valve 11 in the single injection mode using only first fuel injection valve 11 reaches a value above the A-fold of the minimum pulse width Ti2min.

As described above, ECU 21 is configured to control such that fuel is injected from first fuel injection valve 11 while second fuel injection valve 12 is temporarily stopped at the resumption of fuel injection from the deceleration fuel cut-off state. In that event, ECU 21 may diagnose whether or not first fuel injection valve 11 has failed, and causes second fuel injection valve 12 to inject fuel in place of first fuel injection valve 11 if detecting that first fuel injection valve 11 has failed.

ECU 21 can detect whether or not first fuel injection valve 11 has failed based, for example, on the internal pressure of the corresponding cylinder, the engine rotation speed, the air-fuel ratio, and the like. When first fuel injection valve 11 has failed and is unable to inject fuel, there is no combustion pressure in the corresponding cylinder. This causes the variation pattern of the engine rotation speed to no longer match with the current combustion state, and keeps the air-fuel ratio to an over-lean range. Thus, based on these, ECU 21 can diagnose whether or not first fuel injection valve 11 has failed.

Although the invention has been described in detail with reference to the preferred embodiment, it is apparent that the invention may be modified into various forms by one skilled in the art based on the fundamental technical concept and teachings of the invention.

For example, though first fuel injection valve 11 and second fuel injection valve 12 may be made of the same parts so as to have the same injection characteristics as each other, fuel injection valves 11 and 12 having different minimum pulse widths Ti2min from each other may be instead used.

When the minimum pulse width Ti2min of first fuel injection valve 11 is smaller than the minimum pulse width Ti2min of second fuel injection valve 12, fuel is injected from first fuel injection valve 11 while second fuel injection valve 12 is temporarily stopped at the resumption of fuel injection from the deceleration fuel cut-off.

This permits delay of the resumption of fuel injection from the deceleration fuel cut-off until the engine rotation becomes even lower, and thus can improve fuel economy more. In addition, in this way, the allocation ratio of second fuel injection valve 12 is increased and thus an insufficient fuel flow rate can be prevented in a high load range.

Moreover, the present invention is not limited to the configuration in which first fuel injection valve 11 and second fuel injection valve 12 are disposed on different intake ports. Alternatively, first fuel injection valve 11 and second fuel injection valve 12 may be disposed on the same intake port.

First fuel injection valve 11 and second fuel injection valve 12 may be disposed side by side so as to be approximately the same distance away from the intake valve, or disposed away from each other so as to be located respectively on the upstream side and on the downstream side in the intake flow direction.

Furthermore, also at the resumption of fuel injection in response to stepping on the accelerator during the deceleration fuel cut-off state, fuel injection may be resumed in a manner that fuel is injected from one of the fuel injection valves while fuel injection from the other fuel injection valve is temporarily stopped.

Moreover, the normal fuel injection control is not limited to the injection control including the alternate injection mode and the combined injection mode. The normal fuel injection control may be any control at least by which the amount of fuel to be injected per combustion cycle is divided and allocated between and injected separately from two fuel injection valves.

Moreover, at the resumption of fuel injection from the deceleration fuel cut-off, ECU 21 may activate, among fuel injection valves 11 and 12 illustrated in FIGS. 1A and 1B, fuel injection from fuel injection valve 12 while temporarily stopping fuel injection from fuel injection valve 11.

Furthermore, at the resumption of fuel injection from the deceleration fuel cut-off, ECU 21 may control fuel injection according to the alternate injection mode so as to switch between fuel injection corresponding to the injection pulse width TI from first fuel injection valve 11 and fuel injection corresponding to the injection pulse width TI from second fuel injection valve 12 every predetermined number of combustion cycles.

REFERENCE SYMBOL LIST

1 internal combustion engine,
3, 4 intake port
5 cylinder
6a, 6b intake valve
11 first fuel injection valve
12 second fuel injection valve
21 electronic control unit (ECU)

The invention claimed is:

1. A control apparatus for an internal combustion engine including a first intake port and a second intake port which are branched from an intake passage and independently open to a cylinder; a first fuel injection valve disposed in the first intake port; and a second fuel injection valve disposed in the second intake port, the control apparatus comprising:
   a fuel injection resumption control unit configured to resume fuel injection in response to a decrease in an engine rotation speed during a fuel cut-off state associated with deceleration of the internal combustion engine by
   (i) resuming fuel injection from the first fuel injection valve while stopping fuel injection from the second fuel injection valve when the engine rotation speed decreases to a threshold rotation speed at which a fuel injection amount to the cylinder is equal to or greater than a minimum injection pulse width of the first fuel injection valve; and
   (ii) resuming fuel injection from both the first and second fuel injection valves when the fuel injection amount to the cylinder becomes equal to or greater than twice the minimum injection pulse width of the first fuel injection valve, after the fuel injection from the first fuel injection valve is resumed.

2. The control apparatus for the internal combustion engine according to claim 1, wherein, when resuming fuel injection from the second fuel injection valve after resuming fuel injection from the first fuel injection valve, the fuel injection resumption control unit is configured to resume fuel injection from the second fuel injection valve after the fuel injection amount to the cylinder has increased to be greater than twice the minimum injection pulse width of the first fuel injection valve.

3. The control apparatus for the internal combustion engine according to claim 1, wherein, when resuming fuel injection from the second fuel injection valve after resuming fuel injection from the first fuel injection valve, the fuel injection resumption control unit is configured to set a fuel injection amount from the first fuel injection valve to be smaller than a fuel injection amount from the second fuel injection valve, and afterwards, reduce a difference between the fuel injection amount of the first fuel injection valve and the fuel injection amount of the second fuel injection valve.

4. A control method for an internal combustion engine including a first intake port and a second intake port which are branched from an intake passage and independently open to a cylinder; a first fuel injection valve disposed in the first intake port; and a second fuel injection valve disposed in the second intake port, the control method comprising:

resuming fuel injection in response to a decrease in an engine rotation speed during a fuel cut-off state associated with deceleration of the internal combustion engine by (i) resuming fuel injection from the first fuel injection valve while stopping fuel injection from the second fuel injection valve when the engine rotation speed decreases to a threshold rotation speed at which a fuel injection amount to the cylinder is equal to or greater than a minimum injection pulse width of the first fuel injection valve, and (ii) after having resumed fuel injection from the first fuel injection valve, resuming fuel injection from both the first fuel injection valve and the second fuel injection valve when the fuel injection amount to the cylinder becomes equal to or greater than twice the minimum injection pulse width of the first fuel injection valve.

* * * * *